United States Patent
Li et al.

(10) Patent No.: US 10,727,131 B2
(45) Date of Patent: Jul. 28, 2020

(54) SOURCE AND DRAIN EPITAXY RE-SHAPING

(71) Applicant: Taiwan Semiconductor Manufacturing Co., Ltd., Hsinchu (TW)

(72) Inventors: Kun-Mu Li, Hsinchu (TW); Chih-Chiang Chang, Zhubei (TW); Wen-Chu Hsiao, Tainan (TW); Che-Yu Lin, Hsinchu (TW); Wei-Siang Yang, Changhua (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 78 days.

(21) Appl. No.: 15/625,501

(22) Filed: Jun. 16, 2017

(65) Prior Publication Data

US 2018/0366373 A1    Dec. 20, 2018

(51) Int. Cl.
*H01L 21/8234* (2006.01)
*H01L 29/66* (2006.01)
(Continued)

(52) U.S. Cl.
CPC .. *H01L 21/823431* (2013.01); *H01L 21/0243* (2013.01); *H01L 21/0245* (2013.01);
(Continued)

(58) Field of Classification Search
CPC ......... H01L 29/7853; H01L 21/823431; H01L 29/7851; H01L 21/76237
See application file for complete search history.

(56) References Cited

U.S. PATENT DOCUMENTS 7,015,116 B1    3/2006  Lo et al.
8,883,585 B1 *  11/2014 Fumitake ............. H01L 29/785
                                                  257/E21.4
(Continued)

FOREIGN PATENT DOCUMENTS

KR     10-2014-0111575      9/2014

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.
(Continued)

*Primary Examiner* — Edward Chin
(74) *Attorney, Agent, or Firm* — Sterne, Kessler, Goldstein & Fox P.L.L.C.

(57) ABSTRACT

The present disclosure describes a method to form silicon germanium (SiGe) source/drain regions with the incorporation of a lateral etch in the epitaxial source/drain growth process. For example, the method can include forming a plurality of fins on a substrate, where each of the plurality of fins has a first width. The SiGe source/drain regions can be formed on the plurality of fins, where each SiGe source/drain region has a second width in a common direction with the first width and a height. The method can also include selectively etching—e.g., via a lateral etch—the SiGe source/drain regions to decrease the second width of the SiGe source/drain regions. By decreasing the width of the SiGe source/drain regions, electrical shorts between neighboring fins can be prevented or minimized. Further, the method can include growing an epitaxial capping layer over the Si/Ge source/drain regions.

22 Claims, 5 Drawing Sheets

(51) Int. Cl.
*H01L 21/02* (2006.01)
*H01L 29/08* (2006.01)
*H01L 29/165* (2006.01)
*H01L 29/161* (2006.01)
*H01L 21/3065* (2006.01)
*H01L 29/78* (2006.01)

(52) U.S. Cl.
CPC .... *H01L 21/0262* (2013.01); *H01L 21/02502* (2013.01); *H01L 21/02532* (2013.01); *H01L 21/02579* (2013.01); *H01L 21/02609* (2013.01); *H01L 21/02639* (2013.01); *H01L 21/3065* (2013.01); *H01L 21/823418* (2013.01); *H01L 29/0847* (2013.01); *H01L 29/161* (2013.01); *H01L 29/165* (2013.01); *H01L 29/66795* (2013.01); *H01L 29/785* (2013.01); *H01L 29/7848* (2013.01)

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,166,010 B2* | 10/2015 | Kelly | H01L 29/785 |
| 9,236,267 B2 | 1/2016 | De et al. | |
| 9,245,805 B2 | 1/2016 | Yeh et al. | |
| 9,324,820 B1* | 4/2016 | Kelly | H01L 21/82343 |
| 9,418,897 B1 | 8/2016 | Ching et al. | |
| 9,425,259 B1* | 8/2016 | Suk | H01L 29/1054 |
| 9,520,482 B1 | 12/2016 | Chang et al. | |
| 9,812,363 B1 | 1/2017 | Liao et al. | |
| 9,576,814 B2 | 2/2017 | Wu et al. | |
| 9,608,116 B2 | 3/2017 | Ching et al. | |
| 9,634,104 B2* | 4/2017 | Chao | H01L 29/66795 |
| 9,634,143 B1* | 4/2017 | Wahl | H01L 29/7848 |
| 9,660,075 B2* | 5/2017 | Koh | H01L 27/0924 |
| 9,859,380 B2 | 1/2018 | Lee et al. | |
| 2003/0127695 A1* | 7/2003 | Ozawa | H01L 29/41783 257/382 |
| 2011/0210404 A1* | 9/2011 | Su | H01L 29/785 257/401 |
| 2014/0252489 A1* | 9/2014 | Yu | H01L 29/66795 257/368 |
| 2014/0252557 A1* | 9/2014 | Flachowsky | H01L 21/3083 257/618 |
| 2014/0273360 A1* | 9/2014 | Cheng | H01L 29/7853 438/157 |
| 2015/0380489 A1* | 12/2015 | Chan | H01L 27/0886 257/192 |
| 2016/0003890 A1* | 1/2016 | Schulz | G01R 31/2635 315/149 |
| 2017/0323795 A1* | 11/2017 | Li | H01L 29/6659 |
| 2018/0366373 A1* | 12/2018 | Li | H01L 21/82343 |

OTHER PUBLICATIONS

Luo, Jie-Xin, et. al., "The Impact of Shallow-Trench-Isolation Mechanical Stress on the Hysteresis Effect of Partially Depleted Silicon-on-Insulator n-Type Metal-Oxide-Semiconductor Field Effects," Chin.Phys.Lett. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

* cited by examiner

SOURCE AND DRAIN EPITAXY RE-SHAPING

BACKGROUND

Silicon germanium epitaxial layers formed on source/drain terminals of a fin field effect transistor (FINFET) may electrically short in high density areas of a chip where the fin pitch is narrow. Consequently, these electrical shorts can result in FINFET performance degradation and wafer yield loss.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
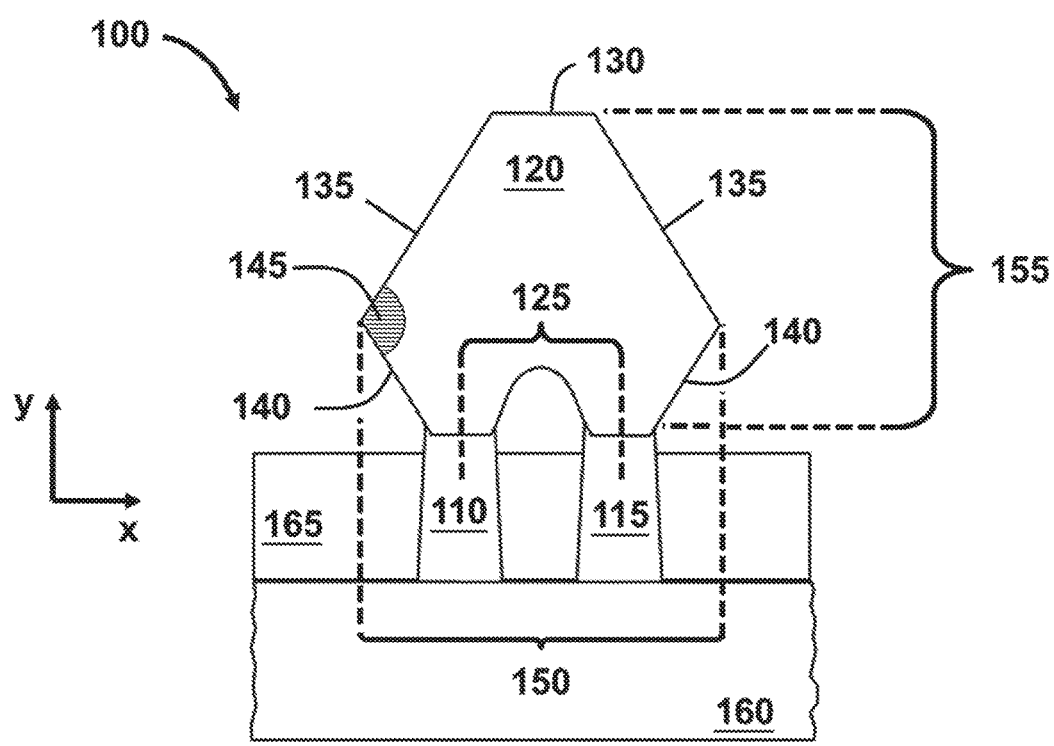
FIG. 1 shows a cross-sectional view of a silicon germanium epitaxially grown source or drain region of a two-fin structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances. Unless defined otherwise, technical and scientific terms used herein have the same meanings as commonly understood by one of ordinary skill in the art to which this disclosure belongs.

As semiconductor manufacturing advances, smaller critical dimensions (CDs) and higher density areas with smaller pitch geometries are needed. However, in high density areas of a chip that include, for example, fin field effect transistor (FINFET) structures, smaller pitch geometries can be challenging. For example, fin pitch of the FINFET structures can create challenges to source/drain (S/D) formation for single-fin structures that are closely spaced to one another. For fins that are closely spaced (e.g., less than 60 nm spacing between FINFET structures), an epitaxial silicon germanium (SiGe) S/D of a fin can electrically short with the SiGe S/D of a neighboring fin. This undesirable situation results in wafer yield loss.

The present disclosure is directed to an in-situ lateral etching process that "trims" the sides of epitaxially grown SiGe S/D regions to minimize or prevent electrical shorts without limiting FINFET performance. According to some embodiments, the lateral etch process can be tailored to decrease the width of the SiGe S/D region without substantially affecting the S/D height. Furthermore, in some embodiments, to compensate for the width reduction, the height and the dopant concentrations of the SiGe S/D can be adjusted accordingly so that there is minimal or no performance penalty.

Depending on the chip's design, different fin layouts can be used, in which each fin layout may feature a different fin pitch or fin spacing. For example, the chip can include areas with single-fin structures that have individual S/D structures or areas with two-fin structures that can have merged S/D regions. In addition, each chip area may have different fin pitch and therefore different sensitivity to S/D shorting. Since growth of SiGe S/D regions in the chip fabrication process is a global process and not local for each fin (e.g., using an independent processing step for each fin), changes in the SiGe S/D growth process can affect all areas of the chip. Therefore monitoring dense areas of the chip which have tight fin pitch is necessary. Areas with tight fin pitch can be considered "weak points" or sensitive areas of the chip. In the description that follows, two exemplary fin structures are discussed: (i) a two-fin structure; and (ii) a single-fin structure.

FIG. 1 shows a cross-sectional view of an exemplary two-fin structure 100. Fins 110 and 115 share a common p-type SiGe S/D region 120. P-type S/D region 120 can have a high concentration of holes (majority carriers) as a result of a hole-donor dopant such as boron (B). In some embodiments, SiGe S/D region 120 merges two S/D regions, in which each S/D region is individually grown on fins 110 and 115. In some embodiments, SiGe S/D region 120 can have a hexagonal-like shape of FIG. 1. In some embodiments, fin pitch 125 can be between 10 and 40 nm. S/D region 120 has a top surface 130 and a pair of side surfaces 135 and 140. An angle 145 is formed between side surfaces 140 and 135 that can range from approximately 45° to 65° according to some embodiments. SiGe S/D region 120 has a width 150 and a height 155, which both can be optimized for device performance. In some embodiments, width 150 can range from 50 to 90 nm and height 155 can range from 40 to 80 nm. As would be understood by a person of ordinary skill in the art, these dimensions are not limiting.

Further, two-fin structure 100 includes a substrate 160. In some embodiments, substrate 160 can be a bare semiconductor wafer or a top layer of a semiconductor on insulator (SOI) wafer. By way of example and not limitation, a semiconductor substrate can be made of silicon or another elementary semiconductor. For example, the elementary semiconductor can be (i) germanium; (ii) a compound semiconductor including silicon carbide, gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) any combinations thereof. Further, fins 110 and 115 can be made from the same material as semiconductor substrate 160 or from a different material. By way of example and not limitation, fins 110 and 115 are made of silicon.

Fins 110 and 115 of structure 100 are electrically isolated from each other with a shallow trend isolation (STI) layer 165. As would be understood by a person of ordinary skill in the art, STI layer 165 can be silicon oxide, silicon nitride, silicon oxynitride, fluorine-doped silicate glass (FSG), a low-k dielectric material, and/or other suitable dielectric material with appropriate gap fill properties. STI layer 165 can be formed after the fin formation on substrate 160 but before the formation of S/D region 120. For example, the space between the fins can be filled with dielectric material, followed by partial chemical mechanical planarization (CMP) and etch-back of the dielectric material to expose fins 110 and 115. As would be understood by a person of ordinary skill in the art, other fabrication methods for forming STI layer 165 are possible. Further, STI layer 165 can be a multi-layer structure that includes more than one layer of the aforementioned materials.

In some embodiments, the p-type SiGe S/D region 120 can be an epitaxial stack that includes two or more epitaxial layers grown in succession and feature different germanium (Ge) atomic % and B dopant concentrations. By way of example and not limitation, the first layer can have a Ge atomic % that ranges from 0 to 40%, and a B dopant concentration that ranges from $5\times10^{19}$ to $1\times10^{21}$ atoms/cm$^3$. The second epitaxial layer can have a Ge atomic % that ranges from 20 to 80%, and a B dopant concentration that ranges from $3\times10^{20}$ to $5\times10^{21}$ atoms/cm$^3$. Finally, the third epitaxial layer is a capping layer that can have similar Ge atomic % and B dopant concentrations as the first layer (e.g., 0 to 400% for Ge, and $5\times10^{19}$ to $1\times10^{21}$ atoms/cm$^3$ for B dopant). The thickness of these layers can vary depending on the device performance requirements. For example, the first epitaxial layer can have a thickness range between 10 and 20 nm, the second epitaxial layer can have a thickness range between 30 to 60 nm, and the third epitaxial layer (capping layer) can have a thickness range between 0 to 10 nm. In some embodiments, SiGe S/D region 120 can have the hexagonal-like shape of FIG. 1 which is the result of two merged "diamond-shaped" S/D regions—each of the S/D regions is grown on fins 110 and 115. As would be understood by a person of ordinary skill in the art, SiGe S/D width 150 can be monitored through an inline measurement.

In some embodiments, the SiGe epitaxial growth process can be performed at high wafer temperatures ranging from 450 to 740° C. During the epitaxial growth, the process pressure can range between 1 to 100 Torr, and the reactant gasses may include silane (SiH$_4$), disilane (Si$_2$H$_6$), germane (GeH$_4$), diborane (B$_2$H$_6$), hydrochloric acid (HCl), and hydrogen (H$_2$), or nitrogen (N$_2$), or argon (Ar). As would be understood by a person of ordinary skill in the art, the aforementioned ranges and types of gasses are exemplary and are not intended to be limiting. The shape and size of SiGe S/D region 120 may depend on the growth conditions of each individual epitaxial layer (e.g., gas flows, wafer temperature, and process pressure).

Figure 2:
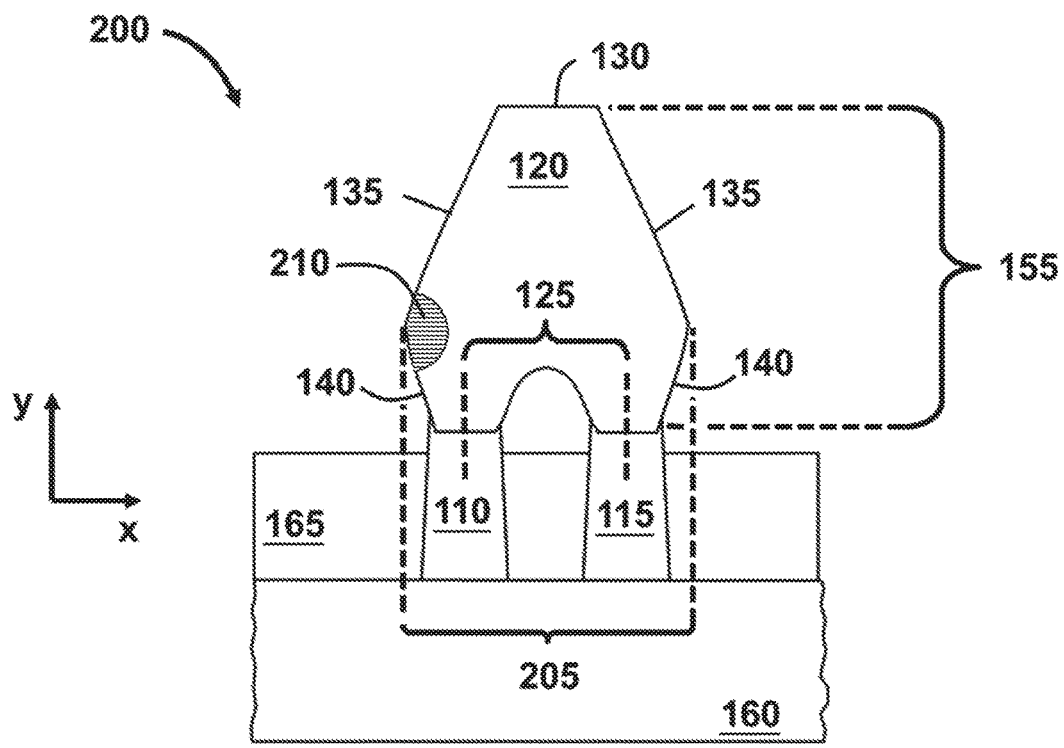
FIG. 2 shows a cross-sectional view of a two-fin structure after an exemplary etching process according to some embodiments.

FIG. 2 shows a cross-sectional view of an exemplary two-fin structure 200. In some embodiments, structure 200 shows a resulting two-fin structure after an exemplary etching process has been performed on structure 100. In some embodiments, the exemplary etching process is a selective lateral etch for SiGe S/D region 120. For example, the etching process can selectively remove SiGe material from side surfaces 135 and 140 along the x-direction to decrease the original S/D width 150 of FIG. 1. The x-direction, as noted in FIG. 2, coincides with the direction of plane (110), which is parallel to the surface of the wafer and in a common direction with the fin's width 205, and the y-direction coincides with the direction of plane (100) which is perpendicular to the surface of the wafer.

In some embodiments, height 155 and the B dopant concentrations can be adjusted to compensate for the lateral SiGe material removal during the etching process. These adjustments can ensure that the final electrical properties of SiGe S/D region 120 are in accordance with design requirements. For example, height 155 can increase if a lateral etching process is performed on SiGe S/D region 120. The adjustment of height 155 is based on the amount of material that will be removed during the lateral etching process. In some embodiments, the adjustment of height 155 can range from 5 to 20 nm. In some embodiments, the B dopant concentration for the second epitaxial layer can be adjusted for similar reasons as the adjustment of height 155. For example, the B dopant concentration range can be decreased from $3\times10^{20}$-$5\times10^{21}$ atoms/cm$^3$ to $1\times10^{20}$-$3\times10^{21}$ atoms/cm$^3$. The height and dopant adjustments can be performed during the second epitaxial layer growth. As would be understood by a person of ordinary skill in the art, these adjustments are performed prior to the selective etching process; and further, the aforementioned adjustment ranges are merely examples and not intended to be limiting.

Top surface 130 may be etched during the lateral etching process, and height 155 may be decreased. The S/D region height loss can range from 0 to 5 nm, according to some embodiments. This can translate to a 12.50% height reduction for a 40 nm high S/D region or a 6.25% height reduction for a 80 nm high S/D region. Due to the directional selectivity of the lateral etching process, a final angle 210 can be wider than the original angle 145 of structure 100, and consequently S/D width 205 is decreased compared to the original S/D width 150 of structure 100. In some embodiments, angle 210 can range from 55° to 180° and the width reduction can be up to 20 nm (e.g., 10 nm from each side).

In some embodiments, the lateral etching process is an in-situ process. For example, the in-situ process can be performed in the same cluster tool or in the epitaxial growth reactor without a vacuum break. As would be understood by a person of ordinary skill in the art, a vacuum break occurs when a wafer exits the cluster tool or the reactor and is exposed to a clean room ambience such as, for example, during the wafer's transfer to a wafer carrier.

In-situ processing can be advantageous for several reasons. For example, an in-situ process does not impact the cluster tool's throughput as much as an ex-situ process which requires a vacuum break such as, for example, a wafer transfer to a carrier and a subsequent transfer to another cluster tool or reactor. The in-situ process also ensures better process and particle control than the ex-situ process. By way of example and not limitation, the lateral etching process can be performed after the formation of the second SiGe epitaxial layer but before the formation of the third epitaxial layer (capping layer). In addition, the SiGe growth and the subsequent etch can be followed by another cycle of SiGe growth and etch if necessary. For example, if the fin pitch is below 50 nm, then a third SiGe growth (e.g., similar to the second SiGe growth in terms of Ge atomic % and B concentration) and a second lateral etch may be required. After the formation of the third SiGe layer, the capping layer is formed thereon (e.g., a fourth epitaxial SiGe layer).

In some embodiments, the etching chemistry can include HCl, $GeH_4$ and chlorine ($Cl_2$). As would be understood by a person of ordinary skill in the art, these gases can be introduced as a gas mixture or one at a time during the selective etching process. By way of example and not limitation, the flow rates for each of the aforementioned gases can range from 40 to 1000 sccm for HCl, 0 to 1000 sccm for $GeH_4$, and 0 to 100 sccm for $Cl_2$. In some embodiments, the wafer temperature during the lateral etching process can range between 450 and 800° C., and the etch time can range from 5 to 1200 seconds. As would be understood by a person of ordinary skill in the art, these ranges are merely examples and other ranges are possible.

In some embodiments, the lateral etch selectivity can be tuned through the etch gas flows and wafer temperature. The etch rate and directional selectivity can also depend on B dopant and Ge atomic %, according to some embodiments. Any or all combinations of wafer temperature, etch gas flows, and dopant concentrations can be used to tailor the etch process and optimize the directional selectivity. In general, higher process temperatures, higher Ge atomic % and higher gas flow rates favor the lateral etch selectivity along the (110) plane (direction of the fin's width).

Figure 3:
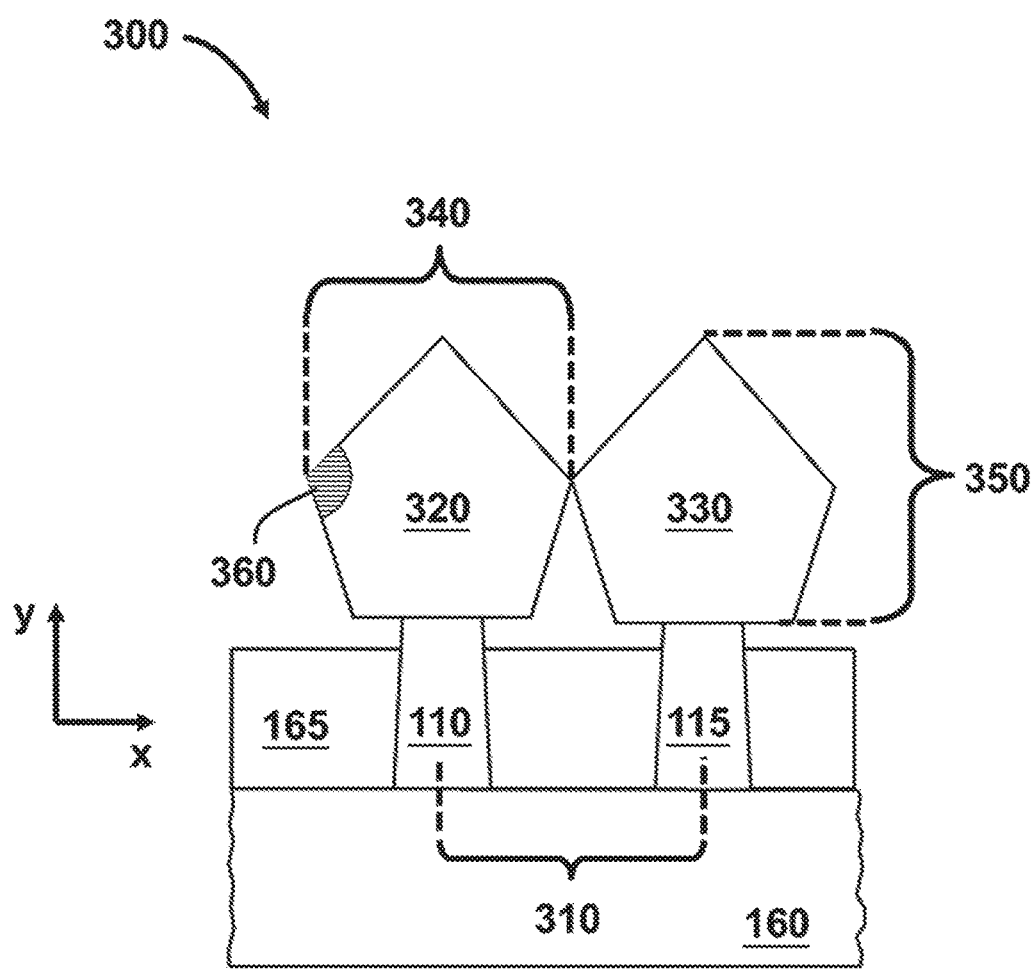
FIG. 3 shows a cross-sectional view of a pair of single-fin structures with epitaxially grown source/drain terminals according to some embodiments.

FIG. 3 shows a cross-sectional view of another exemplary two-fin structure 300. In some embodiments, fins 110 and 115 can each have a fin pitch 310 less than 60 nm. In structure 300, fin 110 has a "diamond shaped" SiGe S/D region 320 and fin 120 has a "diamond shaped" SiGe S/D region 330 as shown in FIG. 3. Both SiGe S/D regions 320 and 330 are grown such that they have a nominally equal width 340 and a nominally equal height 350. In some embodiments, width 340 is about 40 nm and height 350 is about 60 nm. However, these dimensions and shape are only examples and are not intended to be limiting since they are driven by the FINFET performance and can be adjusted accordingly depending on the FINFET's electrical characteristics. Similar to structures 100 and 200 in FIGS. 1 and 2, respectively, structure 300 is on substrate 160 where fins 110 and 115 are isolated with STI layer 165. Side surfaces of SiGe S/D regions 320 and 330 form an angle 360. In some embodiments, angle 360 can range from 45° to 65°.

Due to the fin pitch geometry of structure 300 (e.g., less than 60 nm), SiGe S/D regions 320 and 330 are at risk of being in physical (and electrical) contact at the end of the SiGe epitaxial growth process. This undesirable situation can result in electrical shorting between neighboring FINFETs. To overcome this undesirable situation, an in-situ lateral etching process can be performed to decrease width 340 of each SiGe S/D regions 320 and 330.

Due to variability in the fin's width and height due to process and condition variations, all wafers may not require the same amount of etch. Hence, to account for these variations, different etching process conditions for different wafers. The etching process selection for each wafer is done through a process known as a "feedback process." As would be understood by a person of ordinary skill in the art, a feedback process utilizes information from a critical parameter obtained by an inline measurement (which is typically made after the main process operation) to provide feedback to the process tool of the main process operation. The process tool may make process adjustments based on that feedback. For example, if the measured parameter is close to the manufacturing specification limits or out of the specification limits, a process adjustment is ordered and incoming wafers to the main process operation will receive the process adjustment. The process adjustments can be done automatically, without intervention from an operator, through an automated feedback loop.

The process adjustments are important for processes that slightly drift over time or suffer from intrinsic variation, and hence process adjustments may be required to protect product quality. For example, each wafer after the SiGe S/D process receives a S/D width measurement before it moves to the next processing operation. The measured SiGe S/D width is then fed back to the SiGe process tool and the next incoming wafer receives the etch process parameters that are based on the previously measured wafer.

Figure 4:
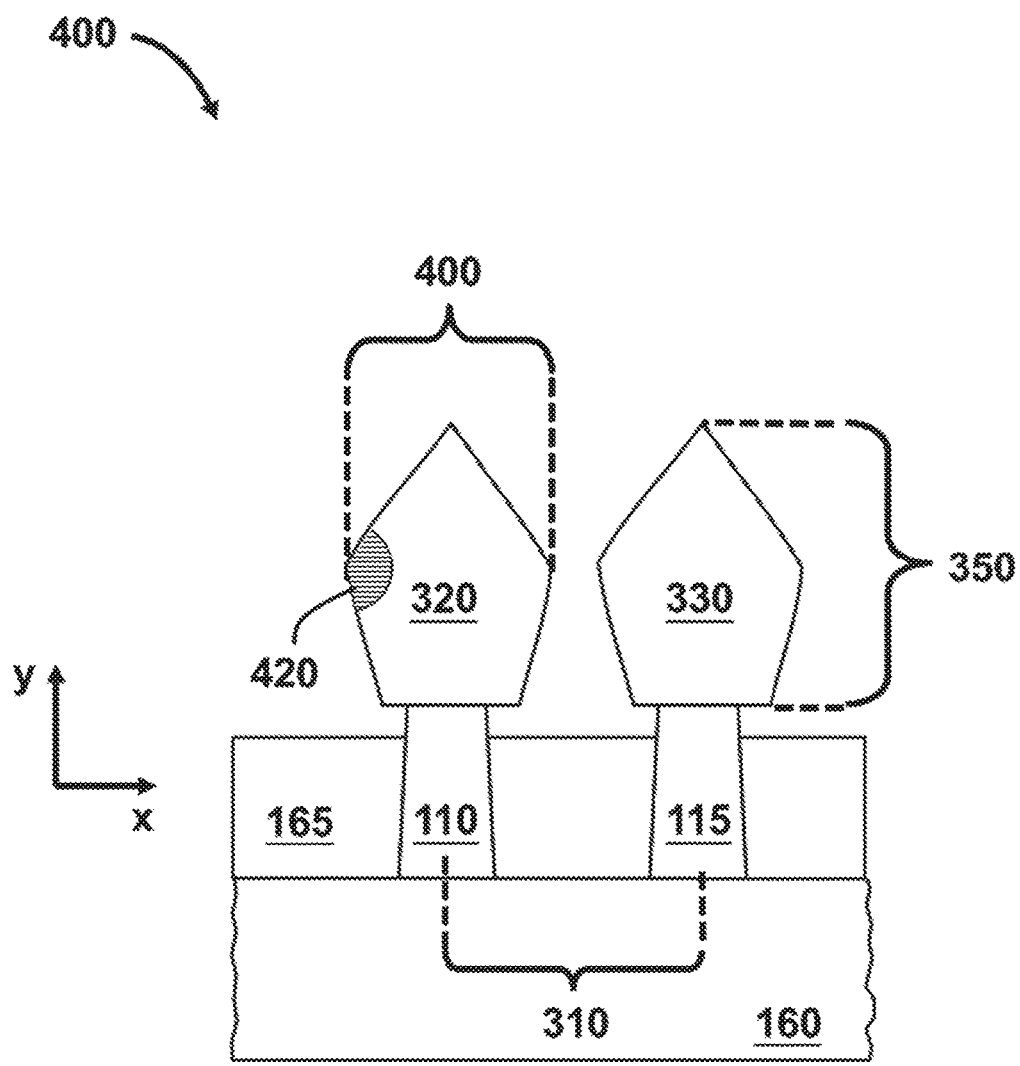
FIG. 4 shows a cross-sectional view of single-fin structures after an exemplary lateral etching process according to some embodiments.

FIG. 4 shows a cross-sectional view of an exemplary two-fin structure 400. In some embodiments, structure 400 shows a resulting two-fin structure after a selective lateral etching process has been performed on structure 300. In some embodiments, a final SiGe S/D width 310 can be narrower compared to the original SiGe S/D width 340. This is accomplished with the lateral removal of SiGe epitaxial material along the x-direction from both SiGe S/D regions 320 and 330. According to some embodiments, the x-direction coincides with the direction of (110) plane or the fin's width direction, and the y-direction coincides with the direction of the (100) plane or the fin's height direction. Due to the lateral etching process, a final angle 420 is wider than the original angle 360. In some embodiments, S/D regions 320 and 330 have an "elongated" diamond shape as shown in FIG. 4. In some embodiments, angle 420 can range from 55° to about 180°. In some embodiments, the etch amount can vary from 0 to 20 nm. Ideally, due to the directional selectivity of the etching process, height 350 should not be affected by the selective etch. However, a 0 to 5 nm height loss is possible, which can translate to a 8.33% height reduction for a 60 nm high S/D.

As mentioned earlier, to ensure that the electrical properties of the FINFET are not compromised, height 350 and the B dopant concentration have to be adjusted accordingly. The adjustment of height 350 is based on the amount of material that will be removed during the lateral etching process and hence on the final S/D width. In some embodiments, the height adjustment can range from 5 to 20 nm. In some embodiments, the B dopant concentration for the second epitaxial layer can be adjusted for similar reasons as the adjustment of height 350. For example, the B dopant concentration range can be decreased from $3\times10^{20}$-$5\times10^{21}$ atoms/$cm^3$ to $1\times10^{20}$-$3\times10^{21}$ atoms/$cm^3$. The height and dopant adjustments can be performed during the second epitaxial layer growth. As would be understood by a person of ordinary skill in the art, these adjustments are merely examples and are not intended to be limiting.

As would be understood by a person of ordinary skill in the art, structures 300 and 100 can be subjected to the same lateral etching process, and structures 400 and 200 can be the resulting respective structures after the lateral etching process. Furthermore, the process changes according to some embodiments are meant to be applied to all SiGe S/D regions of the chip.

Figure 5:
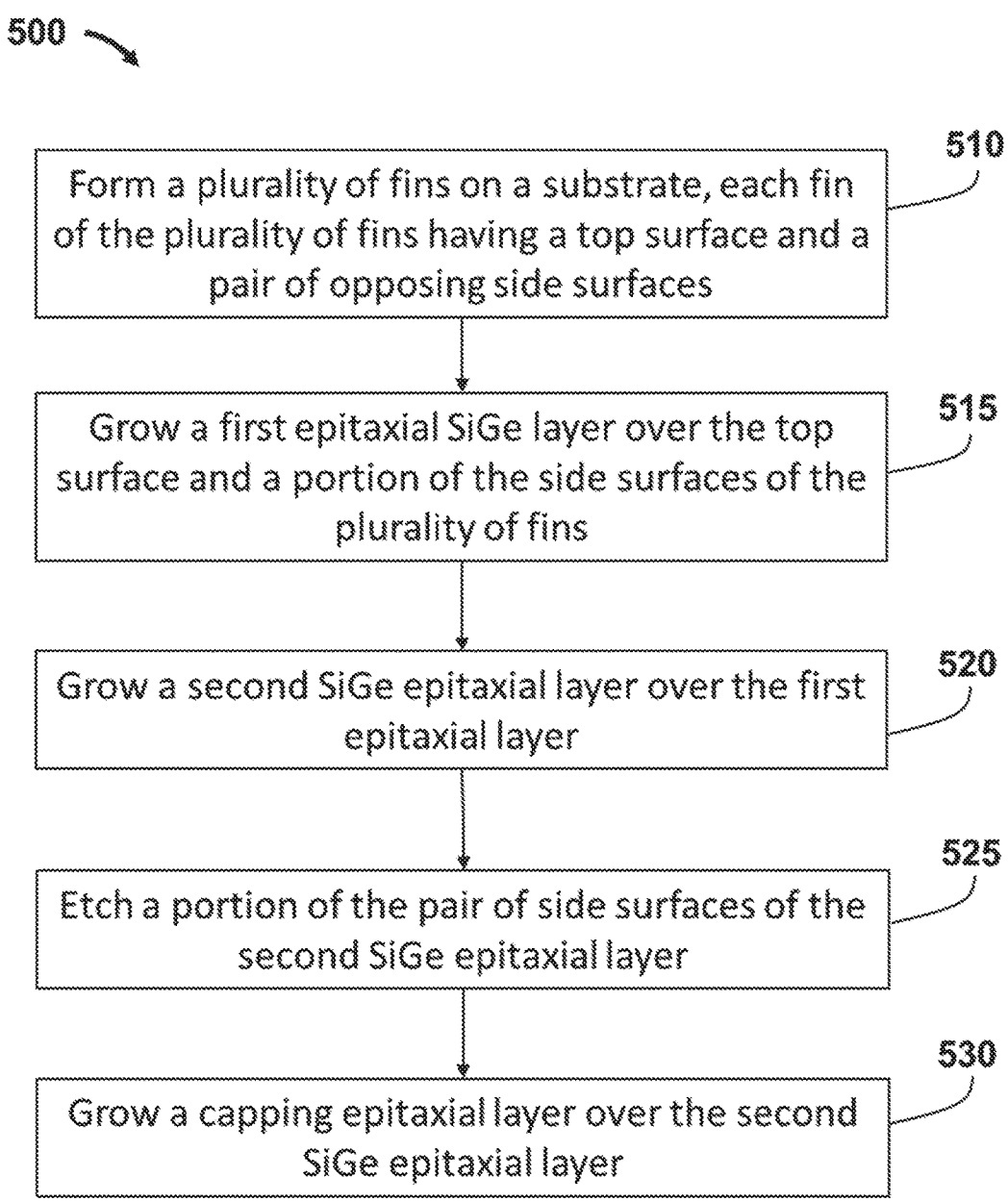
FIG. 5 shows a flow chart of an exemplary silicon germanium source/drain fabrication method according to some embodiments

FIG. 5 shows a flow chart of an exemplary SiGe S/D fabrication method 500 that utilizes an in-situ lateral etching process. The lateral etching process can selectively remove SiGe material from side surfaces of S/D regions and decrease the S/D width according to some embodiments. As would be understood by a person of ordinary skill in the art, other fabrication operations may be performed between the various operations of fabrication method 500 and are omitted merely for clarity. This SiGe S/D fabrication method is not limited to the exemplary fabrication method 500.

Exemplary fabrication method 500 begins with operation 510 and the formation of a plurality of fins on a substrate. Each of the fins has a top surface and a pair of opposing side surfaces. In some embodiments, the substrate can be a bare semiconductor wafer, or the top layer of a semiconductor on insulator (SOI) wafer. As would be understood by a person of ordinary skill in the art, a semiconductor substrate can be made of silicon or another elementary semiconductor. The elementary semiconductor can be, for example, (i) germanium; (ii) a compound semiconductor including silicon carbide, GaAs, GaP, InP, InAs, and/or InSb; (iii) an alloy semiconductor including SiGe, gallium GaAsP, AlInAs, AlGaAs, GaInAs, GaInP, and/or GaInAsP; or (iv) any combinations thereof.

Further, the fins can be made from the same material as the semiconductor substrate or a different material. By way of example and not limitation, the fins can be made from silicon. In addition, the fins can have different pitch on different areas of the wafer (e.g., one fin pitch used for logic FINFETs and another fin pitch used for SRAM FINFETs). The fins can also have different configurations or arrangements on a chip; for example, the fins can be part of a large array of single-fin structures or a part of islands with two-fin structures. As would be understood by a person of ordinary skill in the art, these fin configurations and arrangements are examples and are not intended to be limiting.

The fins are electrically isolated from each other with an STI layer. As would be understood by a person of ordinary skill in the art, the STI layer can be silicon oxide, silicon nitride, silicon oxynitride, FSG, a low-k dielectric material, any other suitable dielectric material with appropriate gap fill properties, or any combination thereof. The STI layer can be formed after the fins. For example, the space between the fins can be filled with dielectric material, followed by a partial CMP and an etch-back process that can selectively recess the STI and expose a portion of the fins' sidewalls. The partial CMP process can remove the STI until the top surface of the fins is exposed. The etch-back process can selectively recess the STI below the level of the fin's top surface. As would be understood by a person of ordinary skill in the art, other fabrication methods for forming the STI layer are possible. By way of example and not limitation, the STI layer can be a stack of more than one dielectric layer.

Exemplary fabrication method 500 continues with operation 515 and the formation of the S/D regions on the fins, where a first epitaxial SiGe layer is grown over the top surfaces and a portion of the side surfaces of the plurality of fins. The epitaxial growth process, which is similar to the layers of the S/D region (first, second, and capping layers), is performed at high wafer temperatures (e.g., 450° C. to 740° C.). During epitaxial growth, the process pressure can range between 1 to 100 Torr. The reactant gasses may include silane ($SiH_4$), disilane ($Si_2H_6$), germane ($GeH_4$), diborane ($B_2H_6$), and hydrochloric acid (HCl). The reactant gases may also include hydrogen ($H_2$), or nitrogen ($N_2$), or argon (Ar).

In some embodiments, the first epitaxial SiGe layer can have a Ge atomic % that ranges from 0 to 40%, and a B dopant concentration that ranges from $5 \times 10^{19}$ to $1 \times 10^{21}$ atoms/cm. In some embodiments, the first epitaxial layer can have a thickness range between 10 and 20 nm. As would be understood by a person of ordinary skill in the art, the aforementioned ranges are not intended to be limiting.

Exemplary fabrication method 500 continues with operation 520 where a second epitaxial SiGe layer is grown over the first SiGe epitaxial layer. In some embodiments, the second epitaxial SiGe layer can have a Ge atomic % between 20 and 80%, and a B dopant concentration that ranges from $1 \times 10^{20}$ to $3 \times 10^{21}$ atoms/$cm^3$. In some embodiments, the thickness of the second epitaxial layer can range from 30 to 60 nm. As would be understood by a person of ordinary skill in the art, the aforementioned ranges are not intended to be limiting.

Depending on the fin pitch and the design layout, the S/D regions of neighboring fins may be allowed to merge. For example, in structure 100 of FIG. 1, the S/D regions from fins 110 and 115 are allowed to merge and form common SiGe S/D region 120. Conversely, in single-fin structure 300 of FIG. 3, SiGe S/D regions 320 and 330 are not merged. Both single-fin and two-fin structures can have a fin pitch below 60 nm. However, a two-fin structure (e.g., structure 100) can have a smaller pitch than a single-fin structure (e.g., structure 300). In other words, pitch 125 in FIG. 1 is smaller than pitch 310 in FIG. 3. In some embodiments, pitch 125 can be below 40 nm; for example, pitch 125 can be between 10 and 40 nm.

In operation 525, an exemplary etching process is introduced to etch a portion of the pair of side surfaces of the second epitaxial SiGe layer. In some embodiments, the etching process can be a lateral etching process, which can be an in-situ process. For example, the etching process can be performed in the same cluster tool or in the epitaxial growth reactor without a vacuum break. This can be advantageous for several reasons. For example, the in-situ process does not impact the tool's throughput as much as an ex-situ process that requires a vacuum break or additional equipment. In addition, the in-situ process ensures better process and particle control than the ex-situ process.

In some embodiments, the lateral etching process can be performed after the formation of the second SiGe epitaxial layer but before the formation of the capping epitaxial layer. In addition, the SiGe growth and the subsequent etch can be followed by another cycle of SiGe growth and etch if necessary. For example, for smaller fin pitch dimensions (e.g., smaller than 50 nm), a third SiGe growth (e.g., similar to the second SiGe growth in terms of Ge atomic % and B concentration) and a second lateral etch may be required. After the formation of the third SiGe layer, the capping layer is formed thereon (e.g., a fourth epitaxial SiGe layer).

In some embodiments, the etching chemistry can include HCl, $GeH_4$, and $Cl_2$. As would be understood by a person of ordinary skill in the art, these gasses may be introduced as a mixture or one at a time. Furthermore, other gas combinations may be possible. By way of example and not limitation, the flows for each of the aforementioned gases can range from 40 to 1000 sccm for HCl, 0 to 1000 sccm for $GeH_4$, and 0 to 100 sccm for $Cl_2$. In some embodiments, the wafer temperature during the lateral etching process can range from 450 to 800° C., while the etch time can range from 5 to 1200 seconds. As would be understood by a person of ordinary skill in the art, these ranges are merely examples and are not intended to be limiting.

In some embodiments, the etching process has high selectivity towards the x-direction or along the (110) plane, which is parallel to the surface of the wafer. Consequently, the etch rate towards the y-direction (e.g., perpendicular to the wafer surface and along the (100) plane) is nominally zero or insignificant. For example, height loss can be limited to 5 nm or less. As would be understood by a person of ordinary skill in the art, the lateral etch selectivity can be tuned through etch process parameters, such as the gas flow rates and the wafer temperature. Etch rate and lateral selectivity can also depend on the B and Ge atomic %s for the second epitaxial SiGe layer and the first SiGe epitaxial layer. Any or all combinations of wafer temperature, etch gas flow rates, Ge atomic %, and B dopant concentrations can be used to tailor the final etch process and optimize the lateral selectivity. In some embodiments, higher process temperatures, higher Ge atomic %, and higher gas flow rates can favor the lateral etch selectivity along the (110) plane, which is the direction of the fin's width (x-direction).

For example, in FIG. 1, the selective etching process can remove material from SiGe S/D side surfaces 135 and 140 along the x-direction, along (110) plane, without substantially etching top surface 130. Hence, the height loss can range from 0 to 5 nm during the lateral etching process. Consequently, after the etch and in referring the FIG. 2, final angle 210 of SiGe S/D 120 can be wider than the original angle 145 in FIG. 1. Also S/D width 205 is decreased compared to the original S/D width 150. In some embodiments, angle 210 can range between 55° and about 180°.

Similarly, FIG. 4 shows an exemplary two-fin structure 400, which can be the result of a lateral etch process performed on structure 300 of FIG. 3, according to some embodiments. As would be understood by a person of ordinary skill in the art, the final SiGe S/D width 400 can be narrower compared to the original SiGe S/D width 340 of FIG. 3. Due to the lateral etching process, the final angle 420 is also wider than the original angle 360. In some embodiments, angle 420 can range from 55° to about 180°. In some embodiments, the lateral etch amount can vary from 0 to 20 nm. Additionally, due to the lateral selectivity of the etching process, height 350 is not substantially affected by the etch. For example, the S/D height loss can range from 0 to 5 nm.

As mentioned earlier, to minimize or avoid FINFET performance degradation due to the volume change of the S/D region after the etch, height and the B dopant concentrations can be adjusted accordingly. For example, a height adjustment can range from 5 to 20 nm and the B dopant concentration range can adjusted from $3 \times 10^{20}$-$5 \times 10^{21}$ atoms/cm³ to $1 \times 10^{20}$-$3 \times 10^{21}$ atoms/cm³. Both adjustments can be performed during the second epitaxial layer growth. As would be understood by a person of ordinary skill in the art, these adjustments are performed prior to the selective etching process. The aforementioned adjustment ranges are merely examples and not intended to be limiting.

In operation 530, a capping epitaxial SiGe layer is grown over the second SiGe epitaxial layer. In some embodiments, the capping epitaxial SiGe layer is similar to the first epitaxial SiGe layer with regard to Ge atomic ° and B dopant concentrations. For example, 0 to 40% for Ge, and $5 \times 10^{19}$ to $1 \times 10^{21}$ atoms/cm³ for the B dopant concentration. In some embodiments, the thickness of the capping epitaxial SiGe layer can range from 0 to 10 nm.

The present disclosure is directed to an in-situ etching process that laterally etches SiGe S/D regions between two neighboring fins of FINFET structures. The lateral etch is performed along the direction of the (110) plane or the direction of the fin's width (x-direction). The lateral etching process can be integrated into the epitaxial growth process of the SiGe S/D regions. For example, the lateral etching process can be an in-situ process. To compensate for SiGe material loss on the S/D regions, the original height and B dopant concentrations of the SiGe S/D regions can be adjusted to avoid FINFET performance degradation. Due to the in-situ lateral etching process, S/D regions of neighboring fins can be better isolated, and electrical shorts can be prevented.

The etch process can be configured to have high selectivity along the (110) plane, thus decreasing the width of the SiGe S/D regions without substantially affecting the S/D regions' height. The lateral selectivity of the etching process can be tailored though critical process parameters such as gas flow rates and wafer temperature. The selectivity can also depend on the Ge atomic % and B dopant concentrations of the second and first SiGe epitaxial layers. In addition, successive cycles of SiGe epitaxial growth and selective lateral etch may be needed for smaller fin pitch dimensions (e.g., fin pitches below 50 nm), according to some embodiments. As would be understood by a person of ordinary skill in the art, the present disclosure can be extended to other applications that require selective etching of SiGe materials such as, for example, micro-electro-mechanical systems (MEMS) and 3-D integrated circuits.

In some embodiments, a method of laterally etching an epitaxial layer includes a plurality of fins formed on a substrate, where each fin has a first width. Source/drain regions are formed on the plurality of fins, and each source/drain region has a second width in a common direction with the first width of the fin and a height. The source/drain regions are selectively etched to decrease the second width of the source/drain regions. An epitaxial capping layer is grown over the source/drain regions.

In some embodiments, a method of laterally etching an epitaxial layer, includes a plurality of fins formed on a substrate, where each fin has a top surface, sidewall surfaces, and a first width. A source/drain region featuring a height is formed by growing a first epitaxial layer over the top surface and a portion of the sidewall surfaces of each fin. Further growing a second epitaxial layer over the first epitaxial layer, where the second epitaxial layer has a second width in a common direction with the fin's first width. The second epitaxial layer is selectively etched for a predetermined amount of time to decrease the second width of the second epitaxial layer. A third epitaxial layer is grown over the second epitaxial layer, where the third epitaxial layer has a third width which is aligned to the second width of the second epitaxial layer.

In some embodiments, a method of laterally etching an epitaxial layer includes an epitaxial stack with a second epitaxial layer over a first epitaxial layer, and where the epitaxial stack has a height along the (100) plane and a first width along the (110) plane. A portion of the epitaxial stack is selectively etched to decrease the first width along the (110) plane. A third epitaxial layer is grown over the epitaxial stack so that the third epitaxial layer has a second width along the (110) plane.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of laterally etching an epitaxial layer, the method comprising:
   forming a plurality of fins on a substrate;
   forming source/drain regions on the plurality of fins, wherein the forming the source/drain regions comprises:
      growing a first epitaxial layer on the plurality of fins, wherein the first epitaxial layer has a first source/drain width and a first source/drain height;
      growing a second epitaxial layer on the first epitaxial layer to increase the first source/drain width to a second source/drain width and the first source/drain height to a second source/drain height; and
      etching the second epitaxial layer to decrease the second source/drain height less than the second source/drain width; and
   growing an epitaxial capping layer on the etched second epitaxial layer.

2. The method of claim 1, wherein a final height of each of the source/drain regions is between 40 and 80 nm.

3. The method of claim 1, wherein the etching the second epitaxial layer comprises an in-situ etching with hydrochloric acid (HCl), germane ($GeH_4$), and chlorine ($Cl_2$), and wherein a flow rate for HCl is 40 to 1000 sccm, a flow rate for $GeH_4$ is 0 to 1000 sccm, and a flow rate for $Cl_2$ is 0 to 100 sccm.

4. The method of claim 1, wherein the etching decreases the second source/drain height by less than 5 nm and the second source/drain width by less than 20 nm.

5. The method of claim 1, wherein the first and second source/drain widths are along a (110) plane and the first and second source/drain heights are along a (100) plane.

6. The method of claim 1, wherein the growing the first epitaxial layer comprises growing a silicon germanium epitaxial layer with a thickness between 10 and 20 nm, a germanium atomic % between 0 and 40%, and a boron dopant concentration between $5 \times 10^{19}$ and $1 \times 10^{21}$ atoms/$cm^3$.

7. The method of claim 1, wherein the growing the second epitaxial layer comprises growing a silicon germanium epitaxial layer with a thickness between 30 and 60 nm, a germanium atomic % between 20 and 80%, and a boron dopant concentration between $1 \times 10^{20}$ and $3 \times 10^{21}$ atoms/$cm^3$.

8. The method of claim 1, wherein the growing the epitaxial capping layer comprises growing a silicon germanium epitaxial layer with a thickness between 10 and 20 nm, a germanium atomic % between 0 and 40%, and a boron dopant concentration between $5 \times 10^{19}$ and $1 \times 10^{21}$ atoms/$cm^3$.

9. The method of claim 1, wherein the first and second epitaxial layers have a width along the (100) plane.

10. The method of claim 1, wherein the etching the second epitaxial layer comprises etching the second epitaxial layer based on a directional selectivity modulated by a boron and a germanium atomic percentage in the second epitaxial layer.

11. A method of laterally etching an epitaxial layer, the method comprising:
    forming a plurality of fins on a substrate, wherein each of the plurality of fins has a top surface and sidewall surfaces; and
    forming a source/drain region, wherein the forming the source/drain region comprises:
       growing a first epitaxial layer, with a first width and a first height, on the top surface and over a portion of the sidewall surfaces of each fin;
       growing a second epitaxial layer, with a second width and a second height, on the first epitaxial layer with the first width;
       etching the second epitaxial layer to decrease the second width, wherein the etching maintains the second height of the second epitaxial layer; and
       growing a third epitaxial layer on the etched second epitaxial layer, wherein the third epitaxial layer is thinner than the second epitaxial layer and has a third width aligned with the second width of the second epitaxial layer.

12. The method of claim 11, further comprising:
    etching the third epitaxial layer to decrease the third width of the third epitaxial layer; and
    growing a fourth epitaxial layer on the etched third epitaxial layer.

13. The method of claim 11, wherein the etching the second epitaxial layer comprises an in-situ etching of the second epitaxial layer at a temperature between 450 and 800° C. with hydrochloric acid (HCl), germane ($GeH_4$), and chlorine ($Cl_2$), and wherein the in-situ etching comprising introducing the HCl, $GeH_4$, and $Cl_2$ one at a time to form a mixture.

14. The method of claim 11, wherein the etching the second epitaxial layer increases an angle formed by a pair of side surfaces of the second epitaxial layer from a first range between 45° and 65° to a second range between 55° and 180°.

15. The method of claim 11, wherein the first and second epitaxial layers have a height along the (110) plane.

16. The method of claim 13, wherein an etch rate and a directional selectivity of the in-situ etching depends on a boron and a germanium atomic percentage in the second epitaxial layer.

17. A method of laterally etching an epitaxial layer, the method comprising:
    forming an epitaxial layer stack with a second epitaxial layer on a first epitaxial layer, wherein the epitaxial layer stack has a height along an (100) plane and a width along an (110) plane and wherein the second epitaxial layer is thicker than the first epitaxial layer;
    selectively etching the second epitaxial layer to decrease the width along the (110) plane more than the height along the (100) plane, wherein the selectively etching the second epitaxial layer comprises etching based on a directional selectivity modulated by a boron and a germanium atomic percentage in the second epitaxial layer; and
    growing a third epitaxial layer on the epitaxial layer stack.

18. The method of claim 17, further comprising:
    prior to the forming the epitaxial layer stack, forming a plurality of fins on a substrate, wherein each of the plurality of fins has an epitaxial layer stack formed thereon.

19. The method of claim 17, wherein the selectively etching the second epitaxial layer comprises etching at a process temperature between 450 and 800° C.

20. The method of claim 17, wherein the selectively etching the second epitaxial layer comprises etching with hydrochloric acid (HCl), germane (GeH$_4$), and chlorine (Cl$_2$), and wherein a flow rate for HCl is 40 to 1000 sccm, a flow rate for GeH$_4$ is 0 to 1000 sccm, and a flow rate for Cl$_2$ is 0 to 100 sccm.

21. The method of claim 17, further comprising:
    selectively etching the third epitaxial layer to decrease a dimension of the third epitaxial layer along the (110) plane while maintaining another dimension along the (100) plane; and
    growing a fourth epitaxial layer on the third epitaxial layer.

22. The method of claim 17, wherein the selectively etching the second epitaxial layer comprises:
    decreasing the height of the epitaxial layer stack by less than 5 nm; and
    decreasing the width of the epitaxial layer stack by less than 20 nm.

\* \* \* \* \*

UNITED STATES PATENT AND TRADEMARK OFFICE
CERTIFICATE OF CORRECTION

PATENT NO. : 10,727,131 B2
APPLICATION NO. : 15/625501
DATED : July 28, 2020
INVENTOR(S) : Li et al.

Page 1 of 1

It is certified that error appears in the above-identified patent and that said Letters Patent is hereby corrected as shown below:

In the Specification

In Column 3, Line 53, delete "400%" and replace with -- 40% --, therefor.

In Column 8, Line 10, delete "atoms/cm." and replace with -- atoms/cm3. --, therefor.

In Column 9, Line 63, delete "atomic °" and replace with -- atomic % --, therefor.

Signed and Sealed this
Fifteenth Day of September, 2020

Andrei Iancu
*Director of the United States Patent and Trademark Office*